(12) United States Patent
Mizutani

(10) Patent No.: US 8,877,427 B2
(45) Date of Patent: Nov. 4, 2014

(54) PHOTOSENSITIVE RESIN COMPOSITION AND CIRCUIT BOARD WITH METAL SUPPORT USING THE SAME

(75) Inventor: Masaki Mizutani, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 267 days.

(21) Appl. No.: 13/207,045

(22) Filed: Aug. 10, 2011

(65) Prior Publication Data

US 2012/0067626 A1 Mar. 22, 2012

(30) Foreign Application Priority Data

Sep. 17, 2010 (JP) ................... 2010-208660

(51) Int. Cl.
*G03F 7/038* (2006.01)
*H05K 1/02* (2006.01)
*G11B 5/48* (2006.01)
*G03F 7/004* (2006.01)
*H05K 3/28* (2006.01)
*H05K 1/05* (2006.01)

(52) U.S. Cl.
CPC ............ *G11B 5/486* (2013.01); *G03F 7/0045* (2013.01); *G03F 7/038* (2013.01); *G11B 5/4833* (2013.01); *H05K 3/287* (2013.01); *H05K 1/056* (2013.01)
USPC ............... 430/280.1; 174/255; 430/275.1; 430/277.1; 430/311; 430/319

(58) Field of Classification Search
None
See application file for complete search history.

(56) References Cited

U.S. PATENT DOCUMENTS

| | | | |
|---|---|---|---|
| 5,665,523 | A | 9/1997 | Omote et al. |
| 5,858,518 | A | 1/1999 | Omote et al. |
| 6,048,663 | A | 4/2000 | Fujii et al. |
| 6,096,482 | A | 8/2000 | Omote et al. |
| 6,100,582 | A | 8/2000 | Omote et al. |
| 7,115,673 | B2 | 10/2006 | Mochizuki et al. |
| 7,575,812 | B2 | 8/2009 | Terada et al. |
| 7,670,752 | B2 | 3/2010 | Hirakawa et al. |
| 2002/0001763 | A1 | 1/2002 | Yasuno et al. |
| 2002/0055062 | A1 | 5/2002 | Hayashi et al. |
| 2004/0013953 | A1 | 1/2004 | Mune et al. |
| 2005/0004288 | A1* | 1/2005 | Koyanagi et al. ............ 524/274 |
| 2005/0208421 | A1 | 9/2005 | Fujii et al. |
| 2006/0199102 | A1 | 9/2006 | Fujii et al. |
| 2007/0293597 | A1 | 12/2007 | Fujii et al. |
| 2008/0097000 | A1 | 4/2008 | Fujii et al. |
| 2009/0068595 | A1 | 3/2009 | Hirakawa et al. |
| 2009/0130432 | A1 | 5/2009 | Fujii et al. |
| 2009/0261060 | A1 | 10/2009 | Mizushima et al. |
| 2010/0047626 | A1 | 2/2010 | Hitomi et al. |

FOREIGN PATENT DOCUMENTS

| | | |
|---|---|---|
| CN | 1268664 C | 8/2006 |
| CN | 101562950 A | 10/2009 |
| JP | 05-281717 A | 10/1993 |
| JP | 07-134417 A | 5/1995 |
| JP | 07-271034 A | 10/1995 |
| JP | 10-39510 A | 2/1998 |
| JP | 10-265572 A | 10/1998 |
| JP | 2002-50854 A | 2/2002 |
| JP | 2002-148804 A | 5/2002 |
| JP | 2003-020339 A | 1/2003 |
| JP | 2003-021898 A | 1/2003 |
| JP | 2003-048956 A | 2/2003 |
| JP | 2003-119247 A | 4/2003 |
| JP | 2003-248311 A | 9/2003 |
| JP | 2005-266075 A | 9/2005 |
| JP | 2006-143996 A | 6/2006 |
| JP | 2006-285193 A | 10/2006 |
| JP | 2007-279489 A | 10/2007 |
| JP | 2008-083684 A | 4/2008 |
| JP | 2008-310946 A | 12/2008 |
| JP | 2009-167381 A | 7/2009 |
| JP | 2009-218329 A | 9/2009 |
| WO | 2007/015423 A1 | 2/2007 |

OTHER PUBLICATIONS

Japanese Office Action dated Nov. 19, 2013, issued in Japanese Patent Application No. 2010-212384, w/English translation (9 pages).
US Office Action dated Nov. 29, 2013 issued in U.S. Appl. No. 13/207,032.
Non-Final Office Action dated Jun. 17, 2013, issued in U.S. Appl. No. 13/207,032.
Chinese Office Action dated Jan. 29, 2014, issued in Chinese Patent Application No. 201110225009.9, w/English translation, (16 pages).
Notification of Reasons for Refusal, dated Jan. 7, 2014, issued in Japanese application No. 2010-208660, w/ English translation.

\* cited by examiner

*Primary Examiner* — Cynthia Hamilton
(74) *Attorney, Agent, or Firm* — Westerman, Hattori, Daniels & Adrian, LLP

(57) ABSTRACT

A photosensitive resin composition contains a component (A) and at least one of a component (B) and a component (C). In addition, in the circuit board with metal support including: a metal support; a base insulating layer; a conductive layer formed of a wiring circuit pattern; and a cover insulating layer, at least one of the above-mentioned base insulating layer and cover insulating layer is made of the above-mentioned photosensitive resin composition.

(A) a 1,4-dihydropyridine derivative represented by the following general formula (1)

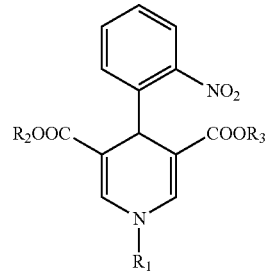

(1)

where $R_1$ represents an alkyl group having 1 to 3 carbon atoms; and $R_2$ and $R_3$ each represent a hydrogen atom or an alkyl group having 1 or 2 carbon atoms and may be identical to or different from each other;
(B) the following (x) and (y):
 (x) a carboxyl group-containing linear polymer; and
 (y) an epoxy resin
(c) a linear polymer having a carboxyl group and an epoxy group.

14 Claims, 6 Drawing Sheets

PHOTOSENSITIVE RESIN COMPOSITION AND CIRCUIT BOARD WITH METAL SUPPORT USING THE SAME

BACKGROUND OF THE INVENTION

1. Field of the Invention

The present invention relates to a photosensitive resin composition which is small in curing shrinkage and excellent in photosensitivity and a circuit board with metal support using the same, and a circuit board with metal support.

2. Description of the Related Art

In recent years, a material called a photosensitive resin composition has been used for a variety of applications such as a semiconductor buffer coat material, a surface protection material for a circuit board, an interlayer insulating material for a circuit board, a light waveguide, a color resist, a black resist, and an overcoat material for a color filter to be used in a liquid crystal display apparatus, a liquid crystal cell gap adjusting material, and a material for a flow path forming member of an ink-jet printer head.

In general, there are given, as main constituent materials for the above-mentioned photosensitive resin composition, a curable and crosslinkable monomer and polymer, and a photosensitizer, for example. A photo radical generator for generating a radical through photoirradiation or a photo acid generator for generating an acid through photoirradiation is used as the above-mentioned photosensitizer. The above-mentioned photo radical generator is mainly used as an initiator in the photocuring of a compound having an acryloyl group or a methacryloyl group, such as a multifunctional acrylic monomer. Although the photo radical generator provides a high curing speed, there are such drawbacks that curing is inhibited by oxygen in the air and curing shrinkage is large, for example. Meanwhile, the above-mentioned photo acid generator is used as an initiator in the photo curing of a multifunctional epoxy compound or a vinyl ether-based compound. Although a curable system using the photo acid generator is not inhibited by oxygen, the photo acid generator is difficult to be used in some applications because an acid remaining in a material system causes the corrosion of a metal material, for example.

From the viewpoint of solving such problems, a photocurable system using a photo base generator for generating a basic substance such as an amine through photoirradiation has attracted attention in recent years. The above-mentioned curable system using a photo base generator has such advantages that the system is hardly inhibited by oxygen and the photo base generator remaining in a material system is less liable to cause the corrosion of a metal material, for example. However, under the current circumstances, the curable system has such problems that the system is low in photosensitivity and the photo base generator itself is poor in heat resistance, for example.

A 1,4-dihydropyridine derivative, which is relatively high in photosensitivity and heat resistance, may be used as the above-mentioned photo base generator for the above-mentioned applications. For example, some photosensitive resin compositions each including a polyamide acid as a polyimide precursor blended with the above-mentioned 1,4-dihydropyridine derivative have already been proposed (see JP-A-H05-281717, JP-A-H07-134417, JP-A-H07-271034, JP-A-H10-39510, JP-A-2002-148804, JP-A-2003-248311, JP-A-2005-266075, and JP-A-2006-285193). However, each of the above-mentioned photosensitive resin compositions uses a polyamide acid as a matrix component and hence needs to be cured at a temperature as high as 250° C. or more, which restricts its applications.

Further, photosensitive resin compositions each obtained by applying a specific 1,4-dihydropyridine derivative to an epoxy group-containing compound have been proposed (See JP-A-2003-20339, JP-A-2003-21898, JP-A-2003-48956, and JP-A-2009-167381). However, there has been such a problem that 1,4-dihydropyridine, which is expensive, needs to be incorporated in a large amount in order to provide practical photosensitivity in such a technical field, for example.

Meanwhile, in recent years, there have been increasing demands for increases in capacity of a hard disk drive (hereinafter, also referred to as "HDD") and in rate of information throughput. Such HDD includes a component called a magnetic head (MRH), which is a thin film, and a component called a suspension board with circuit for supporting the magnetic head. In addition, the suspension board with a circuit to be used in the above-mentioned hard disk drive is a wiring circuit board having a wiring circuit pattern for connecting the magnetic head to a read/write board integrally formed on a suspension board for supporting the magnetic head. That is, the above-mentioned suspension board with circuit is formed so that a base insulating layer made of a polyimide resin is provided on a substrate made of metal such as a stainless-steel foil, a given pattern circuit formed of a conductive layer made of copper is formed as a thin film thereon, a terminal is further formed thereon, and the entire surface excluding the terminal is covered and protected with a cover insulating layer (covering layer), for example (see, for example, JP-A-H10-265572). In addition, the above-mentioned suspension board with the circuit has been widely popularized in recent years because the suspension board with circuit can resist an air flow in the case where the above-mentioned magnetic head and a magnetic disk serving as a recording medium relatively run and retain a minor interval between the suspension board with circuit and the magnetic disk to provide a satisfactory levitation attitude of the magnetic head.

Such a suspension board with a circuit is generally provided with a slider having a magnetic head mounted on the leading end, and there is a need for precisely adjusting a levitation attitude (angle) of the slider relative to a magnetic disk.

In addition, in recent years, in accordance with an improvement in recording density of the magnetic disk, it has been needed to more precisely adjust a pitch static attitude (PSA: attitude angle) of the slider relative to the magnetic disk, and it has been demanded to make a change in PSA due to changes in temperature and humidity as small as possible.

In general, in order to suppress a change in PSA of the slider associated with a change in temperature, coefficients of thermal expansion of a substrate made of metal and a conductive layer are made close to coefficients of thermal expansion of a base insulating layer and a cover insulating layer. Similarly, in order to suppress a change in PSA of the slider associated with a change in humidity, coefficients of hygroscopic expansion of the metal supporting layer and the conductive layer are made close to coefficients of hygroscopic expansion of the base insulating layer and the cover insulating layer.

However, it is extremely difficult to make the coefficients of thermal expansion and the coefficients of hygroscopic expansion of the base insulating layer and the cover insulating layer simultaneously close to those of the substrate made of metal and the conductive layer. In particular, it is very difficult to make the coefficients of hygroscopic expansion of the base insulating layer and the cover insulating layer close to the coefficients of hygroscopic expansion of the substrate made of metal and the conductive layer because the coefficients of hygroscopic expansion of the substrate made of metal and the conductive layer are substantially zero. Thus, under the current circumstances, an attempt to make the coefficients of hygroscopic expansions of the base insulating layer and the cover insulating layer close to those of the substrate made of metal and the conductive layer inevitably sacrifices photosensitivity and other requisite characteristics (see, for example, JP-A-2008-310946).

SUMMARY OF THE INVENTION

As described above, under the current circumstances, there is a demand for a suspension board with a circuit which can suppress a change in PSA of a slider associated with a change in temperature and a change in humidity, especially shows a small change in PSA relative to a change in humidity.

A photosensitive resin composition is herein provided which is small in curing shrinkage and satisfactory in photosensitivity and a circuit board with metal support which uses the photosensitive resin composition and shows a small change in PSA relative to a change in humidity.

A first aspect to achieve the above-mentioned object resides in a photosensitive resin composition, containing the following component (A) and at least one of the following component (B) and component (C):

(A) a 1,4-dihydropyridine derivative represented by the following general formula (1):

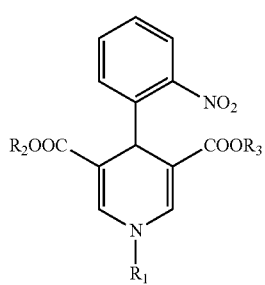

(1)

[in the formula (1): $R_1$ represents an alkyl group having 1 to 3 carbon atoms; and $R_2$ and $R_3$ each represent a hydrogen atom or an alkyl group having 1 or 2 carbon atoms and may be identical to or different from each other];

(B) the following (x) and (y):
 (x) a carboxyl group-containing linear polymer; and
 (y) an epoxy resin; and
(C) a linear polymer having a carboxyl group and an epoxy group.

In addition, a second aspect resides in a circuit board with metal support, including: a metal support; a base insulating layer provided on the above-mentioned metal support; a conductive layer formed of a given wiring circuit pattern provided on the above-mentioned base insulating layer; and a cover insulating layer provided on the above-mentioned conductive layer so as to cover the conductive layer, in which at least one of the above-mentioned base insulating layer and cover insulating layer is made of the above-mentioned photosensitive resin composition.

Further, a third aspect resides in a circuit board with metal support, including: a metal support; a base insulating layer provided on the above-mentioned metal support; a first conductive layer formed of a given wiring circuit pattern provided on the above-mentioned base insulating layer; a first cover insulating layer provided on the above-mentioned first conductive layer so as to cover the first conductive layer; a second conductive layer formed of a given wiring circuit pattern provided on the above-mentioned first cover insulating layer; and a second cover insulating layer provided on the above-mentioned second conductive layer so as to cover the second conductive layer, in which at least one layer of layers consisting of the above-mentioned base insulating layer, first cover insulating layer, and second cover insulating layer is made of the above-mentioned photosensitive resin composition.

The use of a photosensitive resin composition containing the above-mentioned specific 1,4-dihydropyridine derivative [component (A)] and a combination of a carboxyl group-containing linear polymer (x) and an epoxy resin (y) or containing the above-mentioned specific 1,4-dihydropyridine derivative [component (A)] and a linear polymer having a carboxyl group and an epoxy group [component (C)], or the combined use of the above-mentioned component (A) and both of the above-mentioned component (B) and component (C) allows providing a product which is small in curing shrinkage and satisfactory in photosensitivity. The photosensitive resin composition is used as a material for forming a base insulating layer or a cover insulating layer of a circuit board with metal support to provide a circuit board with metal support which shows a small change in PSA relative to a change in humidity.

As described above, the photosensitive resin composition contains a 1,4-dihydropyridine derivative represented by the general formula (1) [component (A)] and at least one of a carboxyl group-containing linear polymer (x) and an epoxy resin (y) [component (B)] and a linear polymer having a carboxyl group and an epoxy group [component (C)]. Thus, satisfactory photosensitivity is attained, and when the photosensitive resin composition is used to form a base insulating layer and a cover insulating layer of a circuit board with metal support, the resultant circuit board with metal support is small in curing shrinkage.

In addition, a circuit board with a metal support, includes: a metal support; a base insulating layer provided on the above-mentioned metal support; a conductive layer formed of a given wiring circuit pattern provided on the above-mentioned base insulating layer; and a cover insulating layer provided on the above-mentioned conductive layer so as to cover the conductive layer, at least one of the above-mentioned base insulating layer and cover insulating layer is made of the above-mentioned photosensitive resin composition. Alternatively, in the circuit board with the metal support, includes: a metal support; a base insulating layer provided on the above-mentioned metal support; a first conductive layer formed of a given wiring circuit pattern provided on the above-mentioned base insulating layer; a first cover insulating layer provided on the above-mentioned first conductive layer so as to cover the first conductive layer; a second conductive layer formed of a given wiring circuit pattern provided on the above-mentioned first cover insulating layer; and a second cover insulating layer provided on the above-mentioned second conductive layer so as to cover the second conductive layer, at least one layer of layers consisting of the above-mentioned base insulating layer, first cover insulating layer, and second cover insulating layer is made of the above-mentioned photosensitive resin composition. As described above, the circuit board with the metal support has a base insulating layer and a cover coat layer formed using the above-mentioned photosensitive resin composition. Hence, the resultant circuit board with metal support is small in curing shrinkage and thus shows a small change in PSA relative to a change in humidity, that is, is excellent in reliability. Thus, the circuit board with the metal support is useful, for example, for a suspension board with circuit for a magnetic head of HDD or the like.

DETAILED DESCRIPTION OF THE INVENTION

Figure 1:
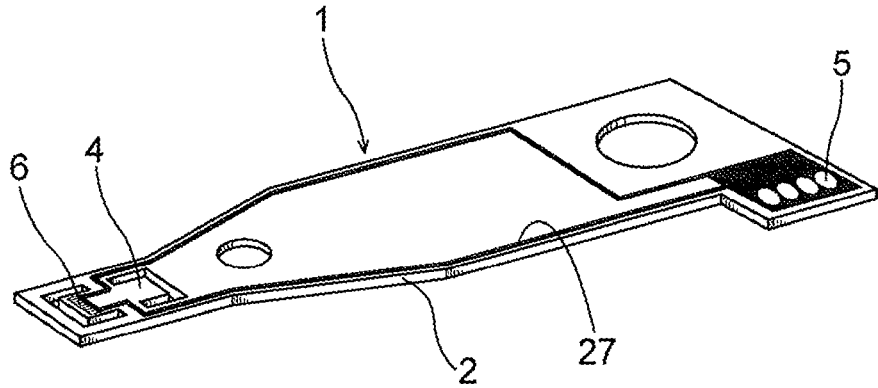
FIG. 1 is a perspective view illustrating an example of a suspension board with circuit using a photosensitive resin composition.

Next, embodiments of the present invention are described. It should be noted that the present invention is by no means limited to the embodiments.

<Photosensitive Resin Composition>

A photosensitive resin composition of the present invention is broadly classified into three aspects. The first aspect is a photosensitive resin composition obtained using a specific 1,4-dihydropyridine derivative (A), a carboxyl group-containing linear polymer (x), and an epoxy resin (y). Further, the second aspect is a photosensitive resin composition obtained using a specific 1,4-dihydropyridine derivative (A) and a linear polymer having a carboxyl group and an epoxy group (C). In addition, the third aspect is a photosensitive resin composition obtained using a specific 1,4-dihydropyridine derivative (A), a carboxyl group-containing linear polymer (x), an epoxy resin (y), and a linear polymer having a carboxyl group and an epoxy group (C). Of those, the first and second aspects are preferred in view of cost and the like.

First, the first aspect is described.

The photosensitive resin composition in the first aspect is obtained using a specific 1,4-dihydropyridine derivative (A), a carboxyl group-containing linear polymer (x), and an epoxy resin (y).

The above-mentioned specific 1,4-dihydropyridine derivative (A) is a 1,4-dihydropyridine derivative represented by the following general formula (1).

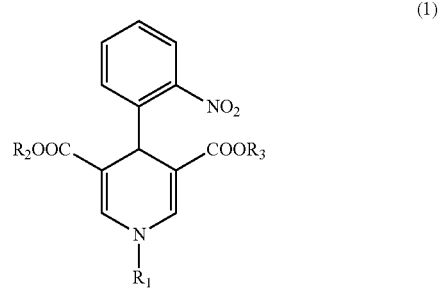

(1)

[In the formula (1): $R_1$ represents an alkyl group having 1 to 3 carbon atoms; and $R_2$ and $R_3$ each represent a hydrogen atom or an alkyl group having 1 or 2 carbon atoms and may be identical to or different from each other.]

Of those, a 1,4-dihydropyridine derivative in which $R_1$ represents $C_2H_5$ and $R_2$ and $R_3$ each represent $CH_3$ in the above-mentioned formula (1) is particularly preferred from the viewpoint of providing compatibility with other components and satisfactory photosensitivity.

The 1,4-dihydropyridine derivative represented by the above-mentioned general formula (1) may be obtained, for example, by subjecting a substituted benzaldehyde, an alkyl propiolate (propargyl acid alkyl ester) in a two-fold molar amount thereof, and the corresponding primary amine to a reaction in glacial acetic acid under reflux (Khim. Geterotsikl. Soed., pp. 1067-1071, 1982).

In addition, the specific 1,4-dihydropyridine derivative (A) has such property that the basicity is increased by photoirradiation, functions as a promoter for a reaction of a carboxyl group and an epoxy group in a photoirradiated portion, and thus exhibits a function of forming a desired image utilizing a difference in solubility in a developing solution based on a difference in rate of a reaction of a carboxyl group and an epoxy group between a photoirradiated portion and a non-photoirradiated portion to be caused by a heating step after photoirradiation.

In the photosensitive resin composition, the content of the 1,4-dihydropyridine derivative (A) represented by the above-mentioned formula (1) is preferably 0.1 to 20% by weight, particularly preferably 0.2 to 18% by weight in the entire photosensitive resin composition. This is because there is a tendency that sufficient photosensitivity is hardly obtained when the content is too small, whereas the component (A) is deposited by a deterioration in compatibility with other components and solubility in a developing solution is poor when the content is too large.

Next, a linear polymer of an ethylenically unsaturated compound including a carboxyl group-containing ethylenically unsaturated compound is preferably used as the above-mentioned carboxyl group-containing linear polymer (x) to be used together with the above-mentioned specific 1,4-dihydropyridine derivative (A) from the viewpoint that the carboxylic acid equivalent of the polymer may be easily controlled and physical properties such as a glass transition temperature (Tg) are easily designed because a large number of kinds of raw material monomers are available, for example.

As the above-mentioned carboxyl group-containing ethylenically unsaturated compound, examples include (meth)acrylic acid, a carboxyl-containing styrene derivative, and maleic anhydride. They are used alone or in combination of two or more kinds thereof.

Further, as the ethylenically unsaturated compound excluding the above-mentioned carboxyl group-containing ethylenically unsaturated compound, examples include a (meth)acrylic acid alkyl ester, a (meth)acrylic acid cyclic alkyl ester, (meth)acrylic acid 2-ethylhexyl ester, (meth) acrylic acid tetrahydrofurfuryl ester, (meth)acrylic acid dimethylaminoethyl ester, (meth)acrylic acid diethylaminoethyl ester, phenoxyethyl acrylate, styrene, α-styrene, vinyltoluene, N-vinylpyrrolidone, 2-hydroxyethyl(meth)acrylate, acrylamide, acrylonitrile, methacrylonitrile, N-phenylmaleimide, and cyclohexylmaleimide. They are used alone or in combination of two or more kinds thereof.

The carboxylic acid equivalent of the above-mentioned carboxyl group-containing linear polymer (x) falls within the range of preferably 300 to 1,300, more preferably 350 to 1,200, particularly preferably 400 to 1,100, for example. This is because there is a tendency that no increase in breaking elongation rate occurs owing to an increase in crosslinking density of cured matter when the carboxylic acid equivalent is too small, whereas solubility in a developing solution deteriorates when the carboxylic acid equivalent is too large.

Further, the weight average molecular weight of the above-mentioned carboxyl group-containing linear polymer (x) falls within the range of preferably 5,000 to 100,000, more preferably 6,000 to 90,000, particularly preferably 7,000 to 80,000. This is because there is a tendency that a film formed before curing is liable to fracture when the weight average molecular weight is too small, whereas solubility in a developing solution deteriorates when the weight average molecular weight is too large. It should be noted that the above-mentioned weight average molecular weight is measured, for example, by gel permeation chromatography (GPC) in terms of polystyrene.

There is given, as a manufacturing method for the above-mentioned carboxyl group-containing linear polymer (x), a method described below, for example. That is, the carboxyl group-containing linear polymer may be obtained by the copolymerization of raw material monomer components for providing a carboxyl group-containing linear polymer with a radical generator such as azobisisobutyronitrile in an organic solvent such as propylene glycol monomethyl ether acetate under a nitrogen atmosphere.

In addition, the content of the above-mentioned carboxyl group-containing linear polymer (x) is preferably 15 to 95% by weight, particularly preferably 20 to 90% by weight in the entire photosensitive resin composition. This is because there is a tendency that alkali developability deteriorates when the content is too small, whereas heat resistance and chemical resistance deteriorate when the content is too large.

The epoxy resin (y) to be used together with the above-mentioned specific 1,4-dihydropyridine derivative (A) and carboxyl group-containing linear polymer (x) has roles in exhibiting an image forming ability through its reaction with a carboxyl group of the above-mentioned carboxyl group-containing linear polymer (x) and in improving various physical properties such as heat resistance of cured matter obtained through three-dimensional crosslinking. Such epoxy resin (y) is appropriately selected depending on applications of the photosensitive resin composition. There are given, as the epoxy resin, a bisphenol A type epoxy resin, a bisphenol F type epoxy resin, a bisphenol S type epoxy resin, a novolac type epoxy resin such as a phenol novolac type epoxy resin or a cresol novolac type epoxy resin, an alicyclic epoxy resin, a nitrogen-containing ring epoxy resin such as monoglycidyl isocyanurate, diglycidyl isocyanurate, triglycidyl isocyanurate, or a hydantoin epoxy resin, a hydrogenated bisphenol A type epoxy resin, a hydrogenated bisphenol F type epoxy resin, an aliphatic epoxy resin, and a glycidyl ether type epoxy resin, for example. They are used alone or in combination of two or more kinds thereof.

The molecular weight of the above-mentioned epoxy resin (y) is preferably 100 to 5,000, more preferably 120 to 4,000. This is because there is a tendency that volatilization in a thermal curing step is liable to occur and a problem such as contamination is liable to occur when the molecular weight is too small, whereas solubility in a developing solution is poor when the molecular weight is too large.

The content of the above-mentioned epoxy resin (y) is preferably 5 to 85% by weight, particularly preferably 10 to 80% by weight in the entire photosensitive resin composition. This is because there is a tendency that heat resistance deteriorate when the content is too small, whereas alkali developability deteriorates when the content is too large.

The photosensitive resin composition in the first aspect of the present invention may be appropriately blended with other additives excluding the above-mentioned respective components, i.e., a pigment such as phthalocyanine green or phthalocyanine blue, a filler such as silica, barium sulfate, or talc, an antifoaming agent, a leveling agent, a flame retardant, a stabilizer, a tackifier such as 2-amino-5-mercapto-1,3,4-thiadiazole or 5-amino-1-H-tetrazole, a rust preventive such as benzotriazole, and the like, if required. They are used alone or in combination of two or more kinds thereof.

In addition, it is preferred that those other additives be used in the range of 0.01 to 30% by weight with respect to the entire photosensitive resin composition.

Next, the second aspect as another aspect of the photosensitive resin composition of the present invention is described.

The photosensitive resin composition in the second aspect is obtained using a specific 1,4-dihydropyridine derivative (A) and a linear polymer having a carboxyl group and an epoxy group (C).

The same compound as the 1,4-dihydropyridine derivative represented by the general formula (1) described in the above-mentioned first aspect is used as the above-mentioned specific 1,4-dihydropyridine derivative (A). Further, a manufacturing method therefor is also the same as described in the above-mentioned first aspect.

The content of the 1,4-dihydropyridine derivative (A) represented by the above-mentioned general formula (1) is preferably 0.1 to 20% by weight, particularly preferably 0.2 to 18% by weight in the entire photosensitive resin composition in the same manner as in the first aspect. This is because there is a tendency that sufficient photosensitivity is hardly obtained when the content is too small, whereas the component (A) is deposited by a deterioration in compatibility with other components and solubility in a developing solution is poor when the content is too large.

The linear polymer having a carboxyl group and an epoxy group (C) to be used together with the above-mentioned specific 1,4-dihydropyridine derivative (A) is characterized by being excellent in storage stability at around room temperature as compared to a mixed system of the above-mentioned carboxyl group-containing linear polymer (x) and epoxy resin (y). One possible reason for this is that the above-mentioned epoxy resin (y), which has a relatively low molecular weight, is easy to move and easy to approach a carboxyl group of the carboxyl group-containing linear polymer (x), whereas the above-mentioned linear polymer having a carboxyl group and an epoxy group (C), which has a relatively high molecular weight as described later, is difficult to move, with the result that a reaction between the carboxyl group and the epoxy group hardly proceeds.

The above-mentioned linear polymer having a carboxyl group and an epoxy group (C) is a linear polymer having one or more carboxyl groups and one or more epoxy groups in the same molecule. It is preferred to use, as the above-mentioned linear polymer (C), for example, a copolymer formed of a carboxyl group-containing ethylenically unsaturated compound, an epoxy group-containing ethylenically unsaturated compound, and an ethylenically unsaturated compound having no carboxyl group and no epoxy group in terms of ease of polymerization and ease of adjustment of physical properties such as a glass transition temperature (Tg).

The above-mentioned carboxyl group-containing ethylenically unsaturated compound is, for example, (meth)acrylic acid or a carboxyl group-containing styrene derivative.

The above-mentioned epoxy group-containing ethylenically unsaturated compound is, for example, glycidyl methacrylate or glycidyl acrylate.

The above-mentioned ethylenically unsaturated compound having no carboxyl group and no epoxy group is, for example, a (meth)acrylic acid alkyl ester, a (meth)acrylic acid cyclic alkyl ester, (meth)acrylic acid 2-ethylhexyl ester, (meth)acrylic acid tetrahydrofurfuryl ester, (meth)acrylic acid dimethylaminoethyl ester, (meth)acrylic acid diethylaminoethyl ester, phenoxyethyl acrylate, styrene, α-styrene, vinyltoluene, N-vinylpyrrolidone, 2-hydroxyethyl(meth)acrylate, acrylamide, acrylonitrile, methacrylonitrile, N-phenylmaleimide, or cyclohexylmaleimide. They are used alone or in combination of two or more kinds thereof.

The carboxylic acid equivalent of the above-mentioned linear polymer having a carboxyl group and an epoxy group (C) falls within the range of preferably 300 to 1,300, more preferably 350 to 1,200, particularly preferably 350 to 1,100, for example. This is because there is a tendency that no increase in breaking elongation rate occurs possibly owing to an increase in crosslinking density of cured matter when the carboxylic acid equivalent is too small, whereas solubility in a developing solution deteriorates when the carboxylic acid equivalent is too large.

Further, the epoxy equivalent of the above-mentioned linear polymer having a carboxyl group and an epoxy group (C) falls within the range of preferably 200 to 1,300, more preferably 250 to 1,200, particularly preferably 300 to 1,100, for example. This is because there is a tendency that no increase in breaking elongation rate occurs possibly owing to an increase in crosslinking density of cured matter when the epoxy equivalent is too small, whereas chemical resistance and the like are poor owing to a decrease in crosslinking density when the epoxy equivalent is too large.

Further, the weight average molecular weight of the above-mentioned linear polymer having a carboxyl group and an epoxy group (C) falls within the range of preferably 5,000 to 100,000, more preferably 6,000 to 90,000, particularly preferably 7,000 to 80,000, for example. This is because there is a tendency that a film before curing is liable to fracture when the weight average molecular weight is too small, whereas solubility in a developing solution deteriorates when the weight average molecular weight is too large. It should be noted that the above-mentioned weight average molecular weight is measured, for example, by gel permeation chromatography (GPC) in terms of polystyrene in the same manner as described above.

The content of the above-mentioned linear polymer having a carboxyl group and an epoxy group (C) is preferably 40 to 99.9% by weight, particularly preferably 45 to 99.8% by weight in the entire photosensitive resin composition. This is because there is a tendency that alkali developability, heat resistance, and chemical resistance deteriorate when the content is too small, whereas photosensitivity deteriorates when the content is too large.

In the same manner as in the first aspect, the photosensitive resin composition in the second aspect of the present invention may be appropriately blended with other additives excluding the above-mentioned respective components, i.e., a pigment such as phthalocyanine green or phthalocyanine blue, a filler such as silica, barium sulfate, or talc, an anti-foaming agent, a leveling agent, a flame retardant, a stabilizer, a tackifier such as 2-amino-5-mercapto-1,3,4-thiadiazole or 5-amino-1-H-tetrazole, a rust preventive such as benzotriazole, and the like, if required. They are used alone or in combination of two or more kinds thereof.

In addition, it is preferred that those other additives be used in the range of 0.01 to 30% by weight with respect to the entire photosensitive resin composition.

Next, the third aspect as still another aspect of the photosensitive resin composition of the present invention is described.

The photosensitive resin composition in the third aspect is obtained using a specific 1,4-dihydropyridine derivative (A), a carboxyl group-containing linear polymer (x) and an epoxy resin (y) (B), and a linear polymer having a carboxyl group and an epoxy group (C).

The above-mentioned specific 1,4-dihydropyridine derivative (A) to be used is the same as the 1,4-dihydropyridine derivative represented by the general formula (1) described in the above-mentioned first and second aspects. Further, a manufacturing method therefor is the same as in the above-mentioned first and second aspects.

The content of the 1,4-dihydropyridine derivative (A) represented by the above-mentioned general formula (1) is preferably 0.1 to 20% by weight, particularly preferably 0.2 to 18% by weight in the entire photosensitive resin composition in the same manner as in the first and second aspects. This is because there is a tendency that sufficient photosensitivity is hardly obtained when the content is too small, whereas the component (A) is deposited by a deterioration in compatibility with other components and solubility in a developing solution is poor when the content is too large.

The above-mentioned carboxyl group-containing linear polymer (x) to be used together with the above-mentioned specific 1,4-dihydropyridine derivative (A) is the same as the carboxyl group-containing linear polymer (x) described in the above-mentioned first aspect.

In addition, the above-mentioned epoxy resin (y) to be used is also the same as the epoxy resin (y) described in the above-mentioned first aspect.

The linear polymer having a carboxyl group and an epoxy group (C) to be used together with the above-mentioned specific 1,4-dihydropyridine derivative (A) is also the same as the linear polymer having a carboxyl group and an epoxy group (C) described in the above-mentioned second aspect.

In the same manner as in the first and second aspects, the photosensitive resin composition in the third aspect of the present invention may be appropriately blended with other additives excluding the above-mentioned respective components, i.e., a pigment such as phthalocyanine green or phthalocyanine blue, a filler such as silica, barium sulfate, or talc, an antifoaming agent, a leveling agent, a flame retardant, a stabilizer, a tackifier such as 2-amino-5-mercapto-1,3,4-thiadiazole or 5-amino-1-H-tetrazole, a rust preventive such as benzotriazole, and the like, if required. They are used alone or in combination of two or more kinds thereof.

In addition, it is preferred that those other additives be used in the range of 0.01 to 30% by weight with respect to the entire photosensitive resin composition.

The photosensitive resin composition of the present invention is obtained by blending and mixing the above-mentioned respective components in a predetermined content.

In addition, the photosensitive resin composition of the present invention may be mixed with an organic solvent to prepare a solution, if required, for example, depending on its applications and the like, and the solution may be used. The above-mentioned organic solvent is, for example, a solvent such as propylene glycol monomethyl ether acetate, diethylene glycol monoethyl ether acetate, diethylene glycol monobutyl ether acetate, diethylene glycol monoethyl ether, diethylene glycol monomethyl ether, solvent naphtha, N-methylpyrrolidone, γ-butyrolactone, butyl cellosolve, ethyl cellosolve, methyl cellosolve, toluene, xylene, mesitylene, acetone, methyl ethyl ketone, or methyl isobutyl ketone. They are used alone or in combination of two or more kinds thereof.

The above-mentioned organic solvent may be mixed and used in an amount of about 0 to 200 parts by weight with respect to 100 parts by weight of the photosensitive resin composition, for example.

In the photosensitive resin composition thus obtained, it is preferred that a cured product after curing have a tensile storage modulus at 25° C. of 0.1 to 1.0 GPa, more preferably 0.15 to 0.9 GPa, particularly preferably 0.2 to 0.8 GPa. This is because there is a tendency that the surface becomes liable to adhere to other substances, resulting in poor handleability, in the case of, for example, an insulating layer when the tensile storage modulus is too small, whereas an effect of suppressing a change in PSA decreases when the tensile storage modulus is too large.

As described above, when the photosensitive resin composition having a tensile storage modulus at 25° C. within the above-mentioned range is used, for example, for each insulating layer for forming a circuit board with metal support such as a suspension board with circuit, the following effects are obtained. First, PSA is stabilized against a change in humidity. In addition, oxygen-induced curing inhibition does not occur, image formation at a small exposure dose becomes possible, curing shrinkage is small, a curing temperature as high as 250° C. or more is not required, and as a result, a corrosive action on metal is suppressed.

It should be noted that the above-mentioned tensile storage modulus at 25° C. is measured as described below, for example. That is, a sample for measurement is produced by producing a film formed of a photosensitive resin composition and cutting the film into a piece measuring 5 mm wide by 25 mm long. Then, the above-mentioned sample is used and measured at 25° C., a temperature rising rate of 5° C./min, and a frequency of 1 Hz, in the range of 0 to 50° C. with a viscoelasticity measurement apparatus (RSA-III manufactured by Rheometric Scientific, Inc.).

The photosensitive resin composition may be used, for example, as a material for forming at least one of a base insulating layer and a cover insulating layer each constituting a circuit board with metal support. In particular, when various physical properties of the circuit board with metal support are taken into account, it is preferred that both layers of the base insulating layer and the cover insulating layer be formed using the photosensitive resin composition.

<Circuit Board with Metal Support>

Next, one example of a manufacturing process for a circuit board with metal support in which both layers of the base insulating layer and the cover insulating layer are formed using the photosensitive resin composition is described below.

First, the photosensitive resin composition is prepared. The photosensitive resin composition is applied onto a metal support surface by a comma coat method or a fountain coat method and dried to form a coating film. The application is carried out so that the film has a thickness of preferably 2 to 20 μm, particularly preferably 3 to 15 μm after the drying.

The above-mentioned applied coating film is dried (at preferably 60 to 150° C., more preferably 80 to 120° C. for about 10 minutes, for example) to form a coating film and then is exposed to active light rays such as ultraviolet radiation via a photomask with a predetermined shape pattern, followed by heating at a temperature of generally 80 to 200° C., preferably 90 to 150° C. for about 1 to 20 minutes (post-exposure heat treatment). After that, in order to remove a non-irradiated portion, developing treatment is carried out using an immersion method, a spray method, a paddle method, or the like to remove the non-irradiated portion. A developing solution to be used in the above-mentioned developing treatment is preferably one capable of completely dissolving and removing a non-irradiated portion in an exposed film within an appropriate time. For example, inorganic alkaline aqueous solutions including sodium carbonate, potassium carbonate, sodium hydroxide, and potassium hydroxide, and organic alkaline aqueous solutions including propylamine, butylamine, monoethanolamine, tetramethylammonium hydroxide, and choline are used alone or as a mixture of two or more kinds thereof. Further, the above-mentioned alkaline aqueous solutions may contain solubility adjusting agents such as alcohols and various surfactants, if required. Further, a developing temperature may be around room temperature, i.e., about 25±10° C., or heating may be carried out, if required.

Active light rays such as ultraviolet rays and electron rays may be used as the active light rays to be used in the above-mentioned exposure. Further, as light sources for the active light rays, various light sources, for example, light sources for effectively applying ultraviolet rays such as a carbon arc lamp, a mercury vapor arc lamp, an ultrahigh pressure mercury lamp, a high pressure mercury lamp, and a xenon lamp are used. Further, light sources for effectively applying visible light such as a flood bulb for photography and a solar lamp are also used.

In addition, conditions for applying active light rays are, for example, an exposure wavelength in the range of generally 200 to 450 nm, more preferably 240 to 420 nm and an exposure dose in the range of generally 50 to 2,000 mJ/cm$^2$, preferably 100 to 1,500 mJ/cm$^2$.

Then, an image having a desired negative type pattern is formed by washing with a rinsing solution after the above-mentioned development, and the patterned coating film is cured with heating at 120 to 250° C. over about 1 to 180 minutes. Thus, a base insulating layer having a predetermined pattern is formed on a metal support. Next, a conductive layer formed of a wiring circuit pattern is formed on the above-mentioned base insulating layer in accordance with a known patterning method such as a semi-additive method. Next, in the same manner as the method of forming the base insulating layer described above, a coating film made of the photosensitive resin composition is formed on the above-mentioned conductive layer in accordance with the above-mentioned method. After that, the above-mentioned coating film is exposed to irradiation with active light rays via a photomask having a predetermined pattern, followed by heat treatment (post-exposure heat treatment). Next, a non-exposed portion is removed using a developing solution to form a negative type pattern, to thereby form a cover insulating layer having a predetermined pattern on the above-mentioned conductive layer. Thus, a circuit board with metal support may be manufactured.

The semi-additive method in the formation of the above-mentioned conductive layer is generally an additive method including carrying out deposition on the entire surface of a resin layer (insulating layer) by electroless metal plating, and then subjecting only a wiring pattern portion to electrolytic plating, etching, or both thereof in combination, thereby providing the entire conductor thickness of an electrically separated conductive pattern. More specifically, as described in Japanese Patent Application Laid-open No. 2001-350272, a conductor thin film serving as an undercoat is formed on an insulating layer serving as a base layer, next, a plating resist is formed with a reverse pattern on the undercoat, of a predetermined pattern. Next, a conductive layer is formed as a wiring circuit pattern of a predetermined pattern on a surface on which the plating resist is not formed in the undercoat by plating. After that, the plating resist and undercoat on which the plating resist is laminated are removed. Thus, a conductive layer as a wiring circuit pattern is formed.

Further, the above-mentioned metal support in the circuit board with metal support of the present invention is exemplified by a stainless-steel foil, an aluminum foil, a 42 alloy foil, and other various alloy foils. Further, the above-mentioned material for forming the conductive layer is exemplified by various metal materials each having conductivity such as copper, nickel, gold, solder, or an alloy thereof.

The thickness of the above-mentioned metal support is set to generally 5 to 30 μm, preferably 15 to 25 μm. Further, the thickness of the above-mentioned conductive layer is set to generally 3 to 25 μm, preferably 5 to 20 μm. In addition, the thickness of each of the above-mentioned base insulating layer and cover insulating layer is set to generally 2 to 20 μm, preferably 3 to 15 μm.

In addition, a circuit board with metal support using the photosensitive resin composition and serving as a multi-layer circuit board is described.

The circuit board with metal support serving as the multi-layer circuit board includes a multi-layer structure as described below. A base insulating layer is provided on a metal support in the same manner as described above, and a first conductive layer formed of a predetermined wiring circuit pattern is provided on the above-mentioned base insulating layer. Then, a first cover insulating layer is provided on the above-mentioned first conductive layer so as to cover the first conductive layer, and a second conductive layer formed of a predetermined wiring circuit pattern is further provided on the above-mentioned first cover insulating layer. In addition, a second cover insulating layer is provided on the above-mentioned second conductive layer so as to cover the second conductive layer. In such circuit board with metal support of a multi-layer structure, at least one layer of layers consisting of the above-mentioned base insulating layer, first cover insulating layer, and second cover insulating layer is formed using the photosensitive resin composition. It is particularly preferred that all the layers consisting of the above-mentioned base insulating layer, first cover insulating layer, and second cover insulating layer be formed using the photosensitive resin composition of the present invention. It should be noted that the above-mentioned base insulating layer, first conductive layer, first cover insulating layer, second conductive layer, and second cover insulating layer are molded by the same method as the above-mentioned method.

The circuit board with metal support thus obtained is useful, for example, for a suspension board with circuit for a thin film magnetic head for use in HDD.

Next, there is described a suspension board with circuit as one specific example of the circuit board with metal support of the present invention.

<Suspension Board with Circuit>

FIG. 1 is a perspective view illustrating one example of the above-mentioned suspension board with circuit 1. The suspension board with circuit has an insulating layer (base insulating layer: not shown) made of the photosensitive resin composition of the present invention on a stainless-steel foil substrate 2 and a predetermined pattern circuit serving as a conductive layer 27 made of copper is formed as a thin film thereon. At the leading end, through the cutting into the substrate, a gimbal 4 is formed integrally with the substrate, and a slider (not shown) having a magnetic head is fixed thereon. Further, required terminals 5 and 6 are formed at the front and rear ends of the suspension board with circuit 1, respectively. It should be noted that FIG. 1 illustrates a state in which a covering layer (cover lay: cover insulating layer) for covering and protecting a surface of the suspension board with circuit 1 has been peeled off.

In the suspension board with circuit as one specific example of the circuit board with metal support described above, a manufacturing process in the case where the photosensitive resin composition of the present invention is used as a material for forming each of the insulating layer (base insulating layer) and the covering layer (cover insulating layer) is described in detail with reference to the drawings.

Figure 2:
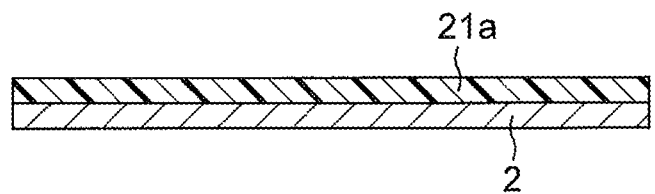
FIG. 2 is a schematic view illustrating a manufacturing method for a suspension board with circuit using the photosensitive resin composition.

First, as illustrated in FIG. 2, a solution of the photosensitive resin composition is applied onto one surface of the stainless-steel foil substrate 2 having a thickness of 5 to 30 μm so that the resultant resin layer has a thickness of generally 2 to 20 μm, more preferably 3 to 15 μm, and heated at generally 60 to 150° C., more preferably 80 to 120° C. to form a coating film 21a made of the above-mentioned photosensitive resin composition.

Next, the coating film 21a made of the photosensitive resin composition is exposed to irradiation with ultraviolet radiation or the like via a photomask for forming a predetermined pattern to form a predetermined pattern.

The above-mentioned exposure dose falls within the range of generally 50 to 2,000 mJ/cm$^2$, preferably 100 to 1,500 mJ/cm$^2$ and the exposure wavelength falls within the range of generally 200 to 450 nm, preferably 240 to 420 nm.

After the above-mentioned exposure, the coating film 21a is heated at a temperature of generally 80 to 200° C., preferably 90 to 150° C. for about 1 to 20 minutes (post-exposure heating) and then subjected to alkali developing treatment to form the coating film 21a with a predetermined pattern.

Figure 3:
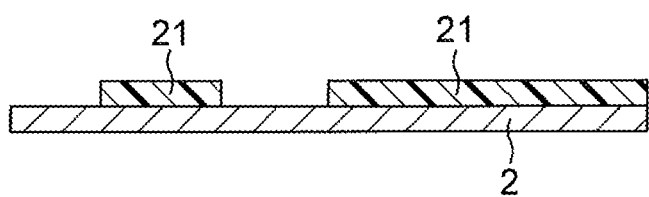
FIG. 3 is a schematic view illustrating the manufacturing method for a suspension board with circuit using a photosensitive resin composition.

After the above-mentioned alkali developing treatment, the patterned coating film of the photosensitive resin composition thus obtained is cured with heating at 120 to 250° C. over about 1 to 180 minutes to form a patterned insulating layer (base insulating layer) 21 made of the photosensitive resin composition on the stainless-steel foil substrate 2, as illustrated in FIG. 3.

Figure 4:
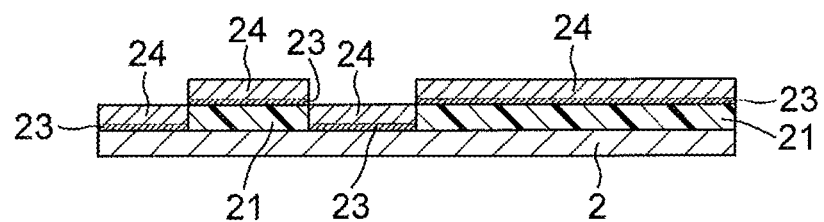
FIG. 4 is a schematic view illustrating the manufacturing method for a suspension board with circuit using the photosensitive resin composition.

Next, as illustrated in FIG. 4, a chromium or titanium thin film 23 and a copper thin film 24 are continuously and successively formed on the entire surface of the stainless-steel foil substrate 2 having the patterned insulating layer 21 by sputtering. The above-mentioned chromium or titanium thin film 23 is useful in terms of allowing the copper thin film 24 to adhere to the insulating layer 21. It is preferred that the above-mentioned chromium or titanium thin film have a thickness in the range of 10 to 60 nm and the above-mentioned copper thin film have a thickness in the range of 30 to 200 nm.

Figure 5:
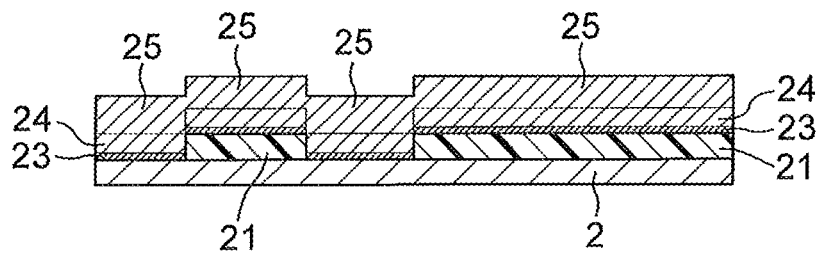
FIG. 5 is a schematic view illustrating the manufacturing method for a suspension board with circuit using the photosensitive resin composition.

After that, as illustrated in FIG. 5, electrolytic copper plating is carried out on the above-mentioned copper thin film 24 to form a conductive layer 25 made of copper having a thickness of about 2 to 15 µm.

Figure 6:
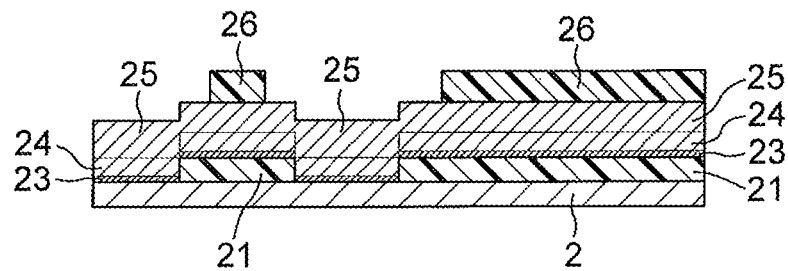
FIG. 6 is a schematic view illustrating the manufacturing method for a suspension board with circuit using the photosensitive resin composition.
Figure 7:
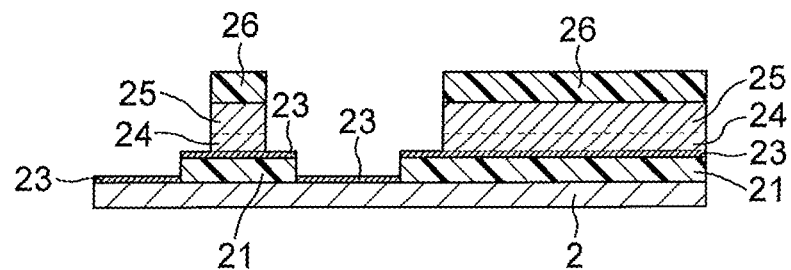
FIG. 7 is a schematic view illustrating the manufacturing method for a suspension board with circuit using the photosensitive resin composition.
Figure 8:
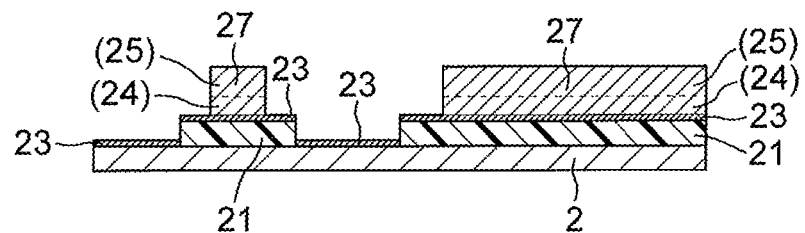
FIG. 8 is a schematic view illustrating the manufacturing method for a suspension board with circuit using the photosensitive resin composition.

Next, as illustrated in FIG. 6 and FIG. 7, after exposure and developing treatment have been carried out by a patterning technology using a photo resist 26 or a dry film laminate in accordance with a conventional method, the conductive layer 25 made of copper in a non-patterned portion is removed by etching to form a conductive layer 27 serving as a predetermined conductive pattern made of copper as described above on the insulating layer 21, as illustrated in FIG. 8. It should be noted that etching treatment for the above-mentioned conductive layer 25 made of copper in the non-patterned portion is preferably alkali etching treatment.

Figure 9:
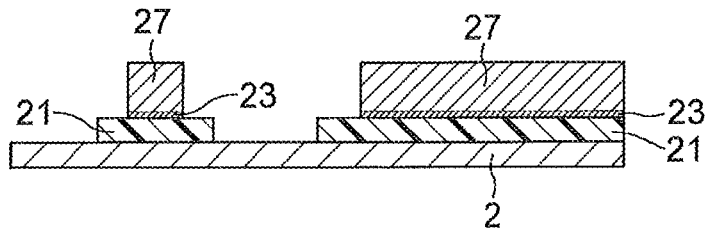
FIG. 9 is a schematic view illustrating the manufacturing method for a suspension board with circuit using the photosensitive resin composition.

After such conductive layer 25 made of copper in the non-patterned portion has been removed by etching, the chromium or titanium thin film 23, which is exposed and unnecessary, is further removed by etching. As a result, as illustrated in FIG. 9, the conductive layer 27 as a predetermined conductive pattern is formed on the insulating layer 21.

In the etching treatment for the above-mentioned chromium or titanium thin film 23, not only a potassium ferricyanide-based etchant but also potassium permanganate- and sodium metasilicate-based etchants are used, for example.

Figure 10:
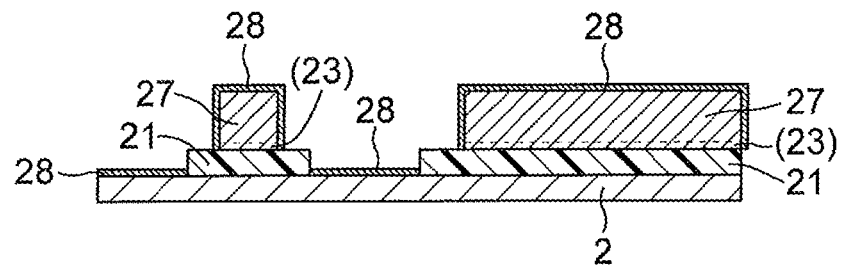
FIG. 10 is a schematic view illustrating the manufacturing method for a suspension board with circuit using the photosensitive resin composition.

After the chromium or titanium thin film 23 unnecessary on the stainless-steel foil substrate 2 has been removed as described above, a hard nickel thin film 28 is formed on each of surfaces of the above-mentioned conductive layer 27 made of copper and stainless-steel foil substrate 2 by carrying out electroless nickel plating to cover and protect the surface of the conductive layer 27 made of copper, as illustrated in FIG. 10. The nickel thin film 28 has only to have such a thickness that the conductive layer 27 as a lower layer is not exposed and the thickness generally falls within the range of 0.05 to 1 µm.

After that, a covering layer (cover insulating layer) is formed so that the conductive layer 27 as a conductive pattern in a wiring portion is covered and protected using the photosensitive resin composition, and a terminal is formed in a required terminal portion and a surface excluding the terminal is similarly covered and protected.

Figure 11:
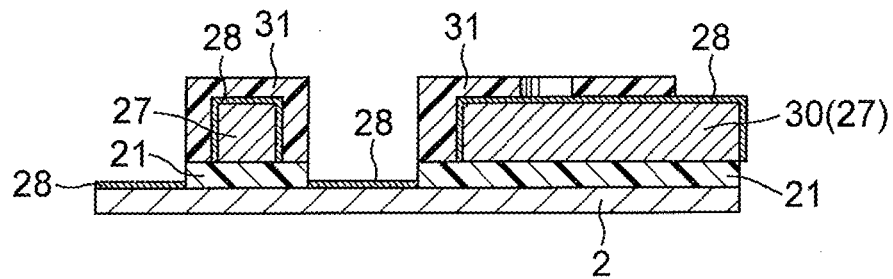
FIG. 11 is a schematic view illustrating the manufacturing method for a suspension board with circuit using the photosensitive resin composition.

Then, FIG. 11 illustrates the formation of the wiring portion on the left side of the stainless-steel foil substrate 2 and the formation of the terminal portion on the right side. That is, as illustrated in FIG. 11, the conductive layer 27 as a conductive pattern is covered with a covering layer 31 in the wiring portion (on the left side of FIG. 10). On the other hand, in the terminal portion (on the right side of FIG. 10), leaving the terminal portion and leaving a lead portion 30 for forming a terminal by electrolytic plating by use of patterning, covering with the above-mentioned photosensitive resin composition is attained by carrying out application, exposure, post-exposure heating, development, and curing with heating using the photosensitive resin composition in the same manner as described above, to thereby form the covering layer (cover insulating layer) 31.

Figure 12:
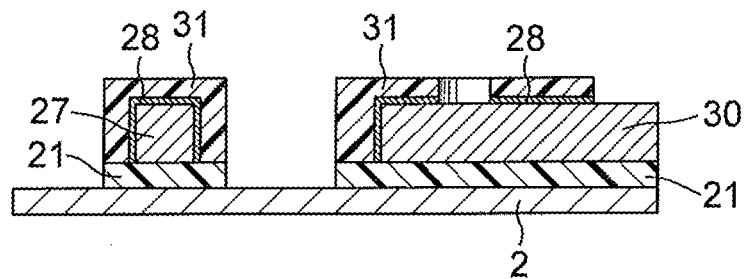
FIG. 12 is a schematic view illustrating the manufacturing method for a suspension board with circuit using the photosensitive resin composition.

Next, as illustrated in FIG. 12, in the terminal portion (on the right side of FIG. 11), first, the electroless nickel plating thin film 28 (see FIG. 10), which has protected the surface of the conductive layer 27 as a conductive pattern, is peeled off, and simultaneously the electroless nickel plating thin film 28 on the stainless-steel foil substrate 2 is also removed.

Figure 13:
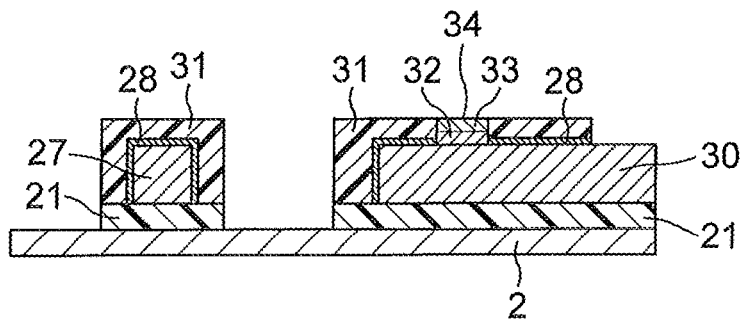
FIG. 13 is a schematic view illustrating the manufacturing method for a suspension board with circuit using the photosensitive resin composition.

After that, leaving only the terminal portion, the stainless-steel foil substrate 2, the conductive layer 27 as a conductive pattern, and the covering layer 31 made of the photosensitive resin composition are covered with a resist by a general method using a photo resist in accordance with a conventional method. Then, as illustrated in FIG. 13, the above-mentioned terminal portion is successively subjected to electrolytic nickel plating 32 and electrolytic gold plating 33 to form a terminal 34. The above-mentioned electrolytic nickel plating 32 and electrolytic gold plating 33 have the following thicknesses, respectively, for example. That is, the electrolytic nickel plating 32 has a thickness of 1 to 5 µm and the electrolytic gold plating 33 has a thickness of about 0.05 to 1 µm.

Figure 14:
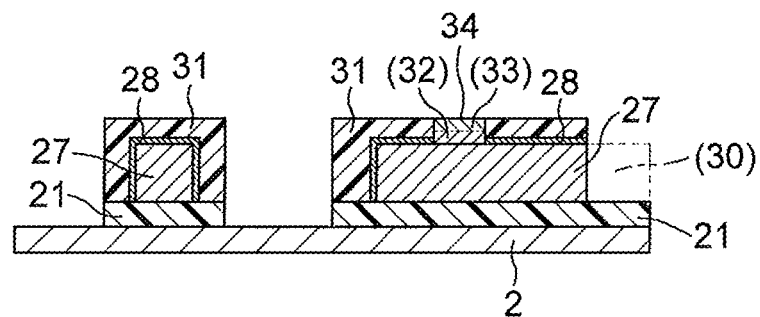
FIG. 14 is a schematic view illustrating the manufacturing method for a suspension board with circuit using the photosensitive resin composition.

After that, the above-mentioned resist is removed. Next, as illustrated in FIG. 14, in the conductive layer 27 formed of a conductive pattern on which the terminal 34 has been formed, the lead portion 30 (see FIG. 11) used for the above-mentioned electrolytic plating is removed by chemical etching (dashed line portion). It should be noted that copper and chromium in the above-mentioned lead portion 30 have only to be removed in accordance with the same method as described above.

Figure 15:
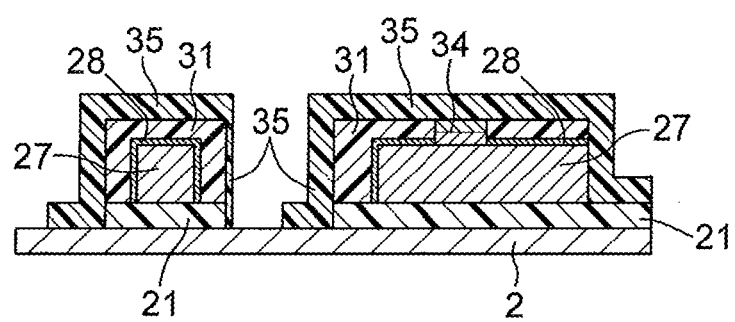
FIG. 15 is a schematic view illustrating the manufacturing method for a suspension board with circuit using the photosensitive resin composition.
Figure 16:
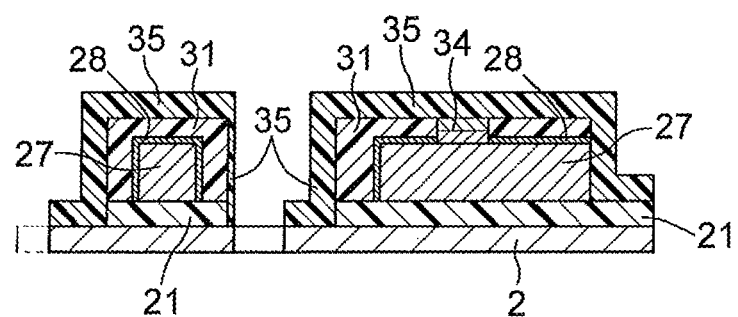
FIG. 16 is a schematic view illustrating the manufacturing method for a suspension board with circuit using the photosensitive resin composition.

After the lead portion 30 has been removed as described above, in order to chemically etch the stainless-steel foil substrate 2 into a predetermined shape, exposure and development are carried out using a photo resist 35 or a dry film laminate in accordance with a conventional method, as illustrated in FIG. 15, to thereby form a predetermined pattern on the stainless-steel foil substrate 2. After that, as illustrated in FIG. 16, the stainless-steel foil substrate 2 is etched into a predetermined shape. Here, the etchant to be used for the above-mentioned etching is, for example, an aqueous solution of ferric chloride, cupric chloride, or the like.

Figure 17:
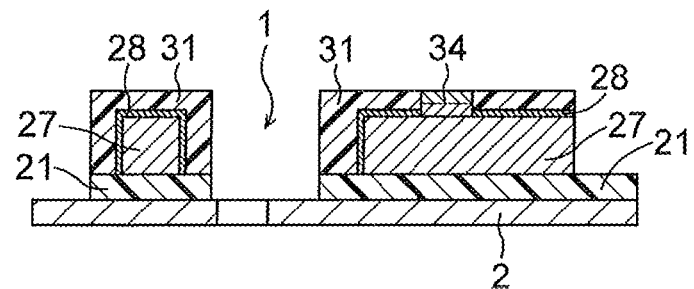
FIG. 17 is a schematic view illustrating the manufacturing method for a suspension board with circuit using the photosensitive resin composition.

After the etching treatment, washing with pure water and drying can provide the suspension board with circuit 1 using the photosensitive resin composition of the present invention as illustrated in FIG. 17.

That is, the suspension board with circuit 1 has the insulating layer 21 made of the photosensitive resin composition of the present invention on the stainless-steel foil substrate 2, and has thereon a pattern circuit as the conductive layer 27 as a thin film formed of a conductive pattern. Except for the terminal 34, the entire surface is covered and protected with the covering layer 31 made of the photosensitive resin composition.

EXAMPLES

Next, examples are described together with comparative examples. It should be noted that the present invention is by no means limited to these examples.

(1) Preparation of Carboxyl Group-Containing Linear Polymer x1

10 g of methacrylic acid, 60 g of butyl acrylate, 30 g of methyl methacrylate, 100 g of propylene glycol monomethyl ether acetate, and 1.0 g of azobisisobutyronitrile were loaded into a 300 mL separable flask under a nitrogen atmosphere, heated with stirring, and subjected to a reaction at 90° C. for 5 hours to afford a carboxyl group-containing linear polymer solution (solids content: 50% by weight) (calculated value for carboxylic acid equivalent of carboxyl group-containing linear polymer: 860, weight average molecular weight: 34,000).

(2) Preparation of Carboxyl Group-Containing Linear Polymer x2

10 g of methacrylic acid, 90 g of phenoxyethyl acrylate, 100 g of propylene glycol monomethyl ether acetate, and 1.0 g of azobisisobutyronitrile were loaded into a 300 mL separable flask under a nitrogen atmosphere, heated with stirring, and subjected to a reaction at 90° C. for 5 hours to afford a carboxyl group-containing linear polymer solution (solids content: 50% by weight) (calculated value for carboxylic acid equivalent of carboxyl group-containing linear polymer: 860, weight average molecular weight: 39,000).

(3) Preparation of Carboxyl Group-Containing Linear Polymer x3

10 g of methacrylic acid, 80 g of butyl acrylate, 10 g of methyl methacrylate, 100 g of propylene glycol monomethyl ether acetate, and 1.0 g of azobisisobutyronitrile were loaded into a 300 mL separable flask under a nitrogen atmosphere, heated with stirring, and subjected to a reaction at 90° C. for 5 hours to afford a carboxyl group-containing linear polymer solution (solids content: 50% by weight) (calculated value for carboxylic acid equivalent of carboxyl group-containing linear polymer: 860, weight average molecular weight: 30,000).

(4) Preparation of Carboxyl Group-Containing Linear Polymer c1

10 g of methacrylic acid, 80 g of phenoxyethyl acrylate, 10 g of glycidyl methacrylate, 150 g of propylene glycol monomethyl ether acetate, and 4.0 g of azobisisobutyronitrile were loaded into a 300 mL separable flask under a nitrogen atmosphere, heated with stirring, and subjected to a reaction at 70° C. for 10 hours to afford a carboxyl group-containing linear polymer solution (solids content: 40% by weight) (calculated value for carboxylic acid equivalent of carboxyl group-containing linear polymer: 860, epoxy equivalent: 1,420, weight average molecular weight: 90,000).

Table 1 below shows the kind and blending amount of monomers used for the preparation of each of the above-mentioned carboxyl group-containing linear polymers x1 to x3 and c1, and the carboxylic acid equivalent (calculated value), epoxy equivalent (calculated value), and weight average molecular weight of each of the resultant carboxyl group-containing linear polymers, collectively.

TABLE 1

| | Carboxyl group-containing linear polymer (g) | | | |
|---|---|---|---|---|
| | x1 | x2 | x3 | c1 |
| Methacrylic acid | 10 | 10 | 10 | 10 |
| Butyl acrylate | 60 | — | 80 | — |
| Methyl methacrylate | 30 | — | 10 | — |
| Phenoxyethyl acrylate | — | 90 | — | 80 |
| Glycidyl methacrylate | — | — | — | 10 |
| Propylene glycol monomethyl ether acetate | 100 | 100 | 100 | 150 |
| Azobisisobutyronitrile | 1.0 | 1.0 | 1.0 | 4.0 |
| Carboxylic acid equivalent (calculated value) | 860 | 860 | 860 | 860 |
| Epoxy equivalent (calculated value) | — | — | — | 1,420 |
| Weight average molecular weight | 34,000 | 39,000 | 30,000 | 90,000 |

(5) Preparation of Polyimide Precursor

Under a nitrogen atmosphere, in a 1 L separable flask, 22.08 g of 1,4-diaminobenzene (PDA) and 7.07 g of 4,4'-diaminodiphenyl ether (DDE) were dissolved in 618 g of N-methylpyrrolidone (NMP). While stirring, to the solution were added 70.85 g of 3,4,3',4'-biphenyltetracarboxylic acid dianhydride (BPDA) to perform polymerization, to thereby produce a polyimide precursor solution. Table 2 below shows the kind and blending amount of monomers used for the preparation of the polyimide precursor, collectively.

TABLE 2

| Polyimide precursor | |
|---|---|
| 3,4,3',4'-Diphenyltetracarboxylic acid dianhydride (BPDA) | 70.85 g |
| 1,4-Diaminobenzene (PDA) | 22.08 g |
| 4,4'-Diaminodiphenyl ether (DDE) | 7.07 g |
| N-Methylpyrrolidone (NMP) | 618 g |

<Preparation of Photosensitive Resin Composition>

(1) The following 1,4-dihydropyridine derivatives A1 to A5 were prepared.

1,4-Dihydropyridine derivative A1: compound in which $R_1$ represents $C_2H_5$ and $R_2$ and $R_3$ each represent $CH_3$ in the general formula (1) 1,4-Dihydropyridine derivative A2: compound in which $R_1$ represents $CH_3$ and $R_2$ and $R_3$ each represent H in the general formula (1) 1,4-Dihydropyridine derivative A3: compound in which $R_1$ represents $C_3H_7$ and $R_2$ and $R_3$ each represent $C_2H_5$ in the general formula (1) 1,4-Dihydropyridine derivative A4: 1,4-dihydropyridine derivative represented by the following formula (2)

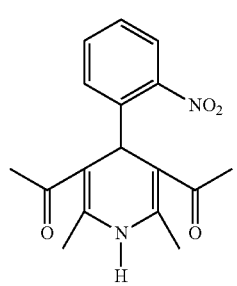

(2)

1,4-Dihydropyridine derivative A5: 1,4-dihydropyridine derivative represented by the following formula (3)

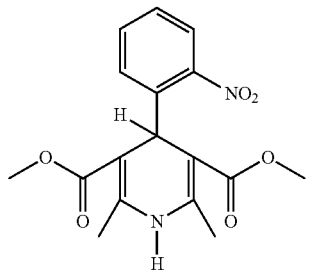

(2) A photo base generator represented by the following formula (4) was prepared.

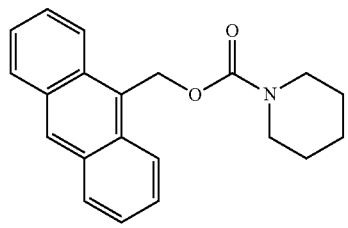

Examples 1 to 7 and Comparative Examples 1 to 4

A photosensitive resin composition was prepared by blending and mixing blend components shown in Table 3 below at a ratio shown in the table. It should be noted that figures in Table 3 below refer to parts by weight of a nonvolatile component and total in 100 parts

TABLE 3

| | | Example | | | | | | | Comparative Example (parts by weight) | | | |
|---|---|---|---|---|---|---|---|---|---|---|---|---|
| | | 1 | 2 | 3 | 4 | 5 | 6 | 7 | 1 | 2 | 3 | 4 |
| Carboxyl group-containing linear polymer | x1 | 83 | — | 78 | — | — | 83 | 83 | 83 | 83 | 83 | — |
| | x2 | — | 83 | — | — | — | — | — | — | — | — | — |
| | x3 | — | — | — | — | 83 | — | — | — | — | — | — |
| | c1 | — | — | — | 95 | — | — | — | — | — | — | — |
| Polyimide precursor | | — | — | — | — | — | — | — | — | — | — | 73 |
| Epoxy resin y1*[1] | | 12 | 12 | — | — | 12 | 12 | 12 | 12 | 12 | 12 | — |
| Epoxy resin y2*[2] | | — | — | 17 | — | — | — | — | — | — | — | — |
| 1,4-Dihydropyridine derivative A1*[3] | | 5 | 5 | 5 | 5 | 5 | — | — | — | — | — | 7 |
| 1,4-Dihydropyridine derivative A2*[4] | | — | — | — | — | — | 5 | — | — | — | — | — |
| 1,4-Dihydropyridine derivative A3*[5] | | — | — | — | — | — | — | 5 | — | — | — | — |
| 1,4-Dihydropyridine derivative A4*[6] | | — | — | — | — | — | — | — | 5 | — | — | — |
| 1,4-Dihydropyridine derivative A5*[7] | | — | — | — | — | — | — | — | — | 5 | — | — |
| Photo base generator*[8] | | — | — | — | — | — | — | — | — | — | 5 | — |
| Additive*[9] | | — | — | — | — | — | — | — | — | — | — | 20 |

*[1]Epicoat YL980 manufactured by Mitsubishi Chemical Corporation: bisphenol A type epoxy resin (epoxy equivalent: 185)
*[2]JER1001 manufactured by Mitsubishi Chemical Corporation: bisphenol A type epoxy resin (epoxy equivalent: 475)
*[3]compound in which $R_1$ represents $C_2H_5$ and $R_2$ and $R_3$ each represent $CH_3$ in the formula (1)
*[4]compound in which $R_1$ represents $CH_3$ and $R_2$ and $R_3$ each represent H in the formula (1)
*[5]compound in which $R_1$ represents $C_3H_7$ and $R_2$ and $R_3$ each represent $C_2H_5$ in the formula (1)
*[6]1,4-dihydropyridine derivative represented by the formula (2)
*[7]1,4-dihydropyridine derivative represented by the formula (3)
*[8]compound represented by the formula (4)
*[9]n-acryloyloxyethylhexahydrophthalimide Next, a suspension board with circuit was produced using the photosensitive resin composition prepared as described above.

<Production of Suspension Board with Circuit>

Example 8

The photosensitive resin composition solution prepared in Example 1 above was applied onto a stainless-steel (SUS304) foil having a thickness of 18 μm and then dried with heating at 100° C. for 2 minutes to form a coating film of a photosensitive resin composition. Next, the resultant was irradiated with ultraviolet rays via a photomask at an exposure dose of 200 mJ/cm$^2$, heated at 110° C. for 3 minutes, and then subjected to development with a 1% sodium carbonate aqueous solution at 30° C. for 2 minutes to form a negative type image. At this time, the thicknesses of the coating film of the photosensitive resin composition before and after the developing treatment were measured with a micrometer, and a residual film rate (%) of the coating film was determined from the expression: (thickness after development/thickness before development) x100.

Next, a patterned undercoat insulating layer (base insulating layer: thickness 10 μm) was formed by heating at 200° C. for 60 minutes, and part of the stainless-steel foil provided with the undercoat insulating layer was cut. After that, the resultant was immersed in a ferric chloride etchant to remove the stainless-steel foil, to thereby afford an undercoat insulating layer having a thickness of 10 μm. The undercoat insulating layer was used to measure a tensile storage modulus at 25° C. in accordance with a method described later.

Next, chromium and copper thin films were formed so as to have thicknesses of 30 nm (chromium)/70 nm (copper), respectively, on the residual undercoat insulating layer on the stainless-steel foil by sputtering treatment. After that, electrolytic copper plating was carried out so that a conductive layer having a thickness of 10 μm was formed on the copper thin film.

In addition, exposure and developing treatment were carried out by a patterning technology using a dry film resist. After that, a conductive layer made of copper in a non-patterned portion was removed by etching, the dry film resist was removed, and then the chromium thin film was removed by etching so that a conductive layer formed of a conductive pattern of a conductive pattern width/pitch width (L/S)=50/50 μm was formed on the undercoat insulating layer.

Next, electroless nickel plating was carried out with a thickness of 0.1 μm on a surface of the above-mentioned conductive layer formed of a conductive pattern, to thereby cover and protect the surface of the above-mentioned conductive layer.

After that, again, a cover insulating layer (having a thickness of 5 μm on the conductive layer) was formed by the same method as described above using the photosensitive resin composition prepared in Example 1 and then subjected to exposure and development using a dry film resist, to thereby form a predetermined pattern on the stainless-steel foil. Then, the stainless-steel foil substrate was immersed in a ferric chloride etchant to produce a suspension board with circuit for evaluation having a size of 5×30 mm.

The resultant suspension board with circuit for evaluation was used to measure warping and a change in PSA.

<<Tensile Storage Modulus at 25° C.>>

The above-mentioned undercoat insulating layer film is cut into a piece measuring 5 mm wide by 25 mm long to produce a sample for measurement. Then, the above-mentioned sample was used and measured with a viscoelasticity measurement apparatus (RSA-III manufactured by Rheometric Scientific) at a temperature rising rate of 5° C./min, a frequency of 1 Hz, and a temperature ranging from 0 to 50° C. A value at 25° C. was defined as a tensile storage modulus.

<<Change in PSA>>

Figure 18A:
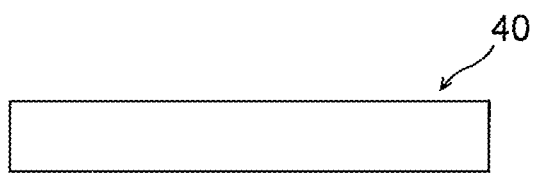
FIG. 18A is a plan view illustrating a sample used for the measurement of a change in PSA of a suspension board with circuit for evaluation produced in Examples and FIG. 18B is a cross-sectional view illustrating the sample.
Figure 18B:
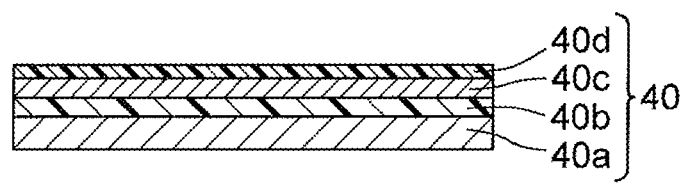
Figures 19A, 19B:
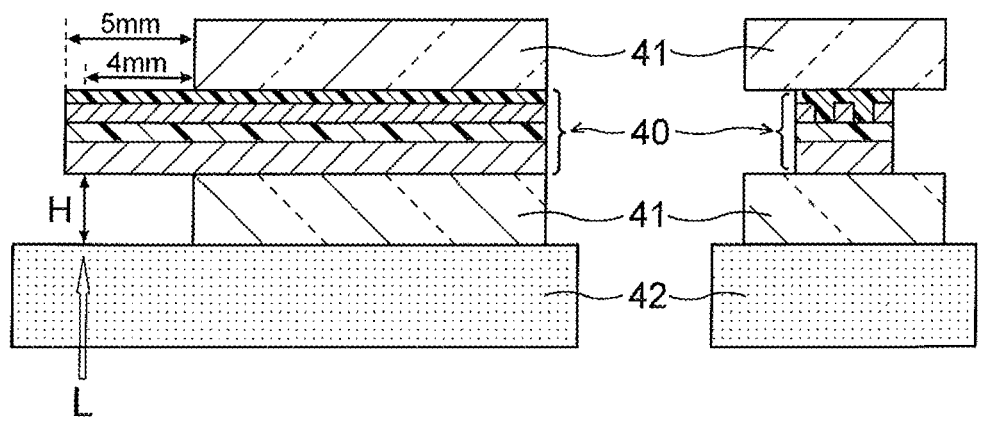
FIG. 19A is a lateral view illustrating a measurement method for a change in PSA of a suspension board with circuit for evaluation produced in Examples and FIG. 19B is a front view illustrating the measurement method.

The resultant suspension board with circuit for evaluation was used to prepare a sample 40 having a size as illustrated in FIG. 18A (5 mm wide×30 mm long). The above-mentioned sample 40 has an undercoat insulating layer (10 μm thick) 40b, a conductive layer (10 μm thick) 40c, and a cover insulating layer (5 μm thick) 40d successively laminated on a stainless-steel foil (18 μm thick) 40a as illustrated in FIG. 18B. Then, as illustrated in FIG. 19, the above-mentioned sample 40 was sandwiched between two slide glass plates (25 mm long×1 mm thick) 41 and the resultant was placed in a high-temperature and high-humidity vessel. Next, at the point 4 mm away from the end of the sandwiched two slide glass plates 41, a distance H (μm) from a glass stage 42 to the stainless-steel foil 40a of the sample 40 was determined by applying laser light L and measuring the reflection. Then, a difference ΔH (μm) between a distance H at 25° C.×10% RH and a distance H at 25° C.×80% RH was determined to calculate a change in PSA (deg/% RH) with the following equation. Then, the case where the change in PSA was less than 0.005 was expressed as a symbol "○" and the case where the change in PSA was 0.005 or more was expressed as a symbol "x". Table 4 below shows the results.

Change in PSA (deg/% RH)=ATAN(Δ$H$/4000)π×180/70

Example 9

A suspension board with circuit for evaluation having a size of 5×30 mm was produced in the same manner as in Example 8 except that the photosensitive resin composition prepared in Example 2 above was used.

Example 10

A suspension board with circuit for evaluation having a size of 5×30 mm was produced in the same manner as in Example 8 except that the photosensitive resin composition prepared in Example 3 above was used.

Example 11

A suspension board with circuit for evaluation having a size of 5×30 mm was produced in the same manner as in Example 8 except that the photosensitive resin composition prepared in Example 4 above was used.

Example 12

A suspension board with circuit for evaluation having a size of 5×30 mm was produced in the same manner as in Example 8 except that the photosensitive resin composition prepared in Example 5 above was used.

Example 13

A suspension board with circuit for evaluation having a size of 5×30 mm was produced in the same manner as in Example 8 except that the photosensitive resin composition prepared in Example 6 above was used.

Example 14

A suspension board with circuit for evaluation having a size of 5×30 mm was produced in the same manner as in Example 8 except that the photosensitive resin composition prepared in Example 7 above was used.

Comparative Example 5

A suspension board with circuit for evaluation having a size of 5×30 mm was attempted to be produced in the same manner as in Example 8 except that the photosensitive resin composition prepared in Comparative Example 1 above was used. However, when the suspension board was irradiated with ultraviolet rays at an exposure dose of 200 mJ/cm$^2$, heated at 110° C. for 3 minutes, and then subjected to developing treatment with a 1% sodium carbonate aqueous solution at 30° C. for 2 minutes, the photosensitive resin composition was wholly dissolved. Then, also when the exposure dose was changed to 2,000 mJ/cm$^2$ and the other conditions were the same as those in Example 8, the photosensitive resin composition was wholly dissolved.

Comparative Example 6

A suspension board with circuit for evaluation having a size of 5×30 mm was attempted to be produced in the same manner as in Example 8 except that the photosensitive resin composition prepared in Comparative Example 2 above was used. However, when the suspension board was irradiated with ultraviolet rays at an exposure dose of 200 mJ/cm$^2$, heated at 110° C. for 3 minutes, and then subjected to developing treatment with a 1% sodium carbonate aqueous solution at 30° C. for 2 minutes, the photosensitive resin composition was wholly dissolved. Then, also when the exposure dose was changed to 2,000 mJ/cm$^2$ and the other conditions were the same as those in Example 8, the photosensitive resin composition was wholly dissolved.

Comparative Example 7

A suspension board with circuit for evaluation having a size of 5×30 mm was attempted to be produced in the same manner as in Example 8 except that the photosensitive resin composition prepared in Comparative Example 3 above was used. However, when the suspension board was irradiated with ultraviolet rays at an exposure dose of 200 mJ/cm$^2$, heated at 110° C. for 3 minutes, and then subjected to developing treatment with a 1% sodium carbonate aqueous solution at 30° C. for 2 minutes, the photosensitive resin composition was wholly dissolved. Then, also when the exposure dose was changed to 2,000 mJ/cm² and the other conditions were the same as those in Example 8, the photosensitive resin composition was wholly dissolved.

Comparative Example 8

The photosensitive resin composition solution (photosensitive polyimide precursor solution) prepared in Comparative Example 4 above was applied onto a stainless-steel (SUS304) foil having a thickness of 18 µm and then dried with heating at 120° C. for 2 minutes to form a coating film of the photosensitive resin composition (photosensitive polyimide precursor). Next, the resultant was irradiated with ultraviolet rays via a photomask at an exposure dose of 700 mJ/cm², heated at 180° C. for 3 minutes, and then subjected to development with a developing solution formed of 5% by weight of tetramethylammonium hydroxide (TMAH)/45% by weight of pure water/50% by weight of ethanol at 30° C. for 2 minutes to form a negative type image. At this time, the thicknesses of the coating film of the photosensitive resin composition before and after the developing treatment were measured with a micrometer. The residual film rate (%) of the coating film was determined from the expression: (thickness after development/thickness before development)×100.

Next, a patterned undercoat insulating layer (10 µm thick) was formed by heating to 400° C. under vacuum, part of the stainless-steel foil provided with the undercoat insulating layer was cut. After that, the resultant was immersed in a ferric chloride etchant to remove the stainless-steel foil, to thereby afford an insulating layer having a thickness of 10 µm. The insulating layer was used to measure a tensile storage modulus at 25° C. in accordance with the above-mentioned method.

Next, chromium and copper thin films were formed so as to have thicknesses of 30 nm (chromium)/70 nm (copper), respectively, on the residual undercoat insulating layer on the stainless-steel foil by sputtering treatment. After that, electrolytic copper plating was carried out so that a conductive layer having a thickness of 10 µm was formed on the copper thin film.

In addition, exposure and developing treatment were carried out by a patterning technology using a dry film resist. After that, a conductive layer made of copper in a non-pattern portion was removed by etching, the dry film resist was removed, and then the chromium thin film was removed by etching so that a conductive layer formed of a conductive pattern of a conductive pattern width/pitch width (L/S)=50/50 µm was formed on the undercoat insulating layer.

Then, electroless nickel plating was carried out with a thickness of 0.1 µm on a surface of the above-mentioned conductive layer formed of a conductive pattern, to thereby cover and protect the surface of the above-mentioned conductive layer.

After that, again, a cover insulating layer (having a thickness of 5 µm on conductive layer) was formed by the same method as described above using the photosensitive resin composition (photosensitive polyimide precursor) prepared in Comparative Example 4 and then subjected to exposure and development using a dry film resist to form a predetermined pattern on the stainless-steel foil. After that, the stainless-steel foil substrate was immersed in a ferric chloride etchant to produce a suspension board with circuit for evaluation having a size of 5×30 mm.

A residual film rate (%), a tensile storage modulus at 25° C. (undercoat insulating layer), and a change in PSA were measured and evaluated in the same manner as in Example 8 above using the suspension board with circuit for evaluation obtained in each of Examples 9 to 14 and Comparative Examples 5 to 8. Table 4 below shows those results collectively. It should be noted that, in the measurement of the residual film rate (%), the exposure dose in the irradiation with ultraviolet rays was set to 200 mJ/cm² and 2,000 mJ/cm² in Comparative Examples 5 to 7 and the exposure dose in the irradiation with ultraviolet rays was set to 700 mJ/cm² in Comparative Example 8. In addition, in the measurement and evaluation of the change in PSA, the photosensitive resin composition was wholly dissolved in Comparative Examples 5 to 7, and hence the suspension board with circuit for evaluation was not able to be produced and evaluated.

TABLE 4

| | Example | | | | | | | Comparative Example | | | |
|---|---|---|---|---|---|---|---|---|---|---|---|
| | 8 | 9 | 10 | 11 | 12 | 13 | 14 | 5 | 6 | 7 | 8 |
| Tensile storage modulus at 25° C. (MPa) | 700 | 920 | 650 | 900 | 400 | 710 | 650 | — | — | — | 7,000 |
| Residual film rate (%) 200 mJ/cm² | >90 | >90 | >90 | >90 | >90 | >90 | >90 | 0 | 0 | 0 | — |
| 700 mJ/cm² | — | — | — | — | — | — | — | — | — | — | 80 |
| 2,000 mJ/cm² | — | — | — | — | — | — | — | 0 | 0 | 0 | — |
| Change in PSA | ○ | ○ | ○ | ○ | ○ | ○ | ○ | — | — | — | x |

The above-mentioned results revealed that all of the products of Examples had a residual film rate of more than 90%, which was a high level. Further, satisfactory evaluation results for the change in PSA were also obtained. In contrast, in the products of Comparative Examples 5 to 7, the photosensitive resin composition was wholly dissolved, and hence the suspension board with circuit for evaluation was not able to be produced and even evaluated. In addition, in the product of Comparative Example 8, the exposure dose in the irradiation with ultraviolet rays was set to 700 mJ/cm² to measure a residual film rate, but the residual film rate is 80%, which was lower than those of the products of Examples. Further, the change in PSA was large change, suggesting that a product, which showed a small change in PSA relative to a change in humidity, was not able to be obtained.

Although specific forms of embodiments of the instant invention have been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention.

The circuit board with metal support using the photosensitive resin composition of the present invention has a small change in PSA relative to a change in humidity and hence is useful, for example, for a suspension board with circuit for a thin film magnetic head of HDD.

What is claimed is:

1. A photosensitive resin composition, comprising:
    component (A), and
    one or both of component (B) and component (C):
    wherein component (A) is a 1,4-dihydropyridine derivative represented by the following general formula (1):

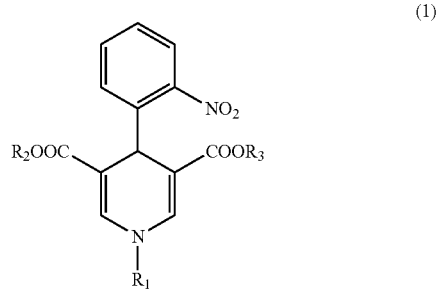

where $R_1$ represents an alkyl group having 1 to 3 carbon atoms; and $R_2$ and $R_3$ each represent a hydrogen atom or an alkyl group having 1 or 2 carbon atoms and may be identical to or different from each other;
    wherein component (B) is a combination comprising (x) and (y):
        wherein (x) is a carboxyl group-containing linear polymer having a carboxylic acid equivalent of 300 to 1,300; and
        wherein (y) is an epoxy resin having a molecular weight of 100 to 5,000;
    wherein component (C) is a linear polymer comprising a carboxyl group and an epoxy group, the linear polymer having a carboxylic acid equivalent of 300 to 1,300 and an epoxy equivalent of 200 to 1,300,
        wherein a content of component (A) is 0.1 to 20% by weight in the entire photosensitive resin composition,
        wherein, if component (B) is present in the composition:
            a content of (x) is 15 to 95% by weight in the entire photosensitive resin composition, and
            a content of (y) is 5 to 85% by weight in the entire photosensitive resin composition, and
        wherein, if component (C) is present in the composition, a content of component (C) is 40 to 99.9% by weight in the entire photosensitive resin composition.

2. The photosensitive resin composition according to claim 1, wherein $R_1$ represents $C_2H_5$ and $R_2$ and $R_3$ each represent $CH_3$ in the general formula (1).

3. The photosensitive resin composition according to claim 1, wherein a cured product of the photosensitive resin composition having a tensile storage modulus at 25° C. of 0.1 to 1.0 GPa is formed under the following condition (α):
    (α) after drying with heating at 100° C. for 2 minutes, irradiating with ultraviolet rays at an exposure dose of 200 mJ/cm², and then, after heating at 110° C. for 3 minutes, further heating at 200° C. for 60 minutes.

4. The photosensitive resin composition according to claim 2, wherein a cured product of the photosensitive resin composition having a tensile storage modulus at 25° C. of 0.1 to 1.0 GPa is formed under the following condition (α):
    (α) after drying with heating at 100° C. for 2 minutes, irradiating with ultraviolet rays at an exposure dose of 200 mJ/cm², and then, after heating at 110° C. for 3 minutes, further heating at 200° C. for 60 minutes.

5. A circuit board with a metal support, comprising:
    a metal support;
    a base insulating layer provided on the metal support;
    a conductive layer formed of a predetermined wiring circuit pattern provided on the base insulating layer; and
    a cover insulating layer provided on the conductive layer so as to cover the conductive layer,
    wherein at least one of the base insulating layer and the cover insulating layer is made of the photosensitive resin composition according to claim 1.

6. A circuit board with a metal support, comprising:
    a metal support;
    a base insulating layer provided on the metal support;
    a conductive layer formed of a predetermined wiring circuit pattern provided on the base insulating layer; and
    a cover insulating layer provided on the conductive layer so as to cover the conductive layer,
    wherein at least one of the base insulating layer and the cover insulating layer is made of the photosensitive resin composition according to claim 2.

7. A circuit board with a metal support, comprising:
    a metal support;
    a base insulating layer provided on the metal support;
    a first conductive layer formed of a predetermined wiring circuit pattern provided on the base insulating layer;
    a first cover insulating layer provided on the first conductive layer so as to cover the first conductive layer;
    a second conductive layer formed of a predetermined wiring circuit pattern provided on the first cover insulating layer; and
    a second cover insulating layer provided on the second conductive layer so as to cover the second conductive layer,
    wherein at least one layer of layers consisting of the base insulating layer, the first cover insulating layer, and the second cover insulating layer is made of the photosensitive resin composition according to claim 1.

8. A circuit board with a metal support, comprising:
    a metal support;
    a base insulating layer provided on the metal support;
    a first conductive layer formed of a predetermined wiring circuit pattern provided on the base insulating layer;
    a first cover insulating layer provided on the first conductive layer so as to cover the first conductive layer;
    a second conductive layer formed of a predetermined wiring circuit pattern provided on the first cover insulating layer; and
    a second cover insulating layer provided on the second conductive layer so as to cover the second conductive layer,
    wherein at least one layer of layers consisting of the base insulating layer, the first cover insulating layer, and the second cover insulating layer is made of the photosensitive resin composition according to 2.

9. The circuit board with the metal support according to claim 5, wherein the circuit board with the metal support is a suspension board with a circuit adapted for use in a hard disk drive.

10. The circuit board with the metal support according to claim 6, wherein the circuit board with the metal support is a suspension board with a circuit adapted for use in a hard disk drive.

11. The circuit board with the metal support according to claim 7, wherein the circuit board with the metal support is a suspension board with a circuit adapted for use in a hard disk drive.

12. The circuit board with the metal support according to claim 8, wherein the circuit board with the metal support is a suspension board with a circuit adapted for use in a hard disk drive.

13. The photosensitive resin composition according to claim 1, wherein, if component (C) is present in the composition, a weight average molecular weight of the component (C) is 5,000 to 100,000.

14. The photosensitive resin composition according to claim 2, wherein, if component (C) is present in the composition, a weight average molecular weight of the component (C) is 5,000 to 100,000.

* * * * *